(12) United States Patent
Park

(10) Patent No.: US 11,563,062 B2
(45) Date of Patent: *Jan. 24, 2023

(54) DISPLAY DEVICE

(71) Applicant: Samsung Display Co., Ltd., Yongin-Si (KR)

(72) Inventor: Ji Ryun Park, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/473,560

(22) Filed: Sep. 13, 2021

(65) Prior Publication Data
US 2022/0013590 A1 Jan. 13, 2022

Related U.S. Application Data

(63) Continuation of application No. 16/870,623, filed on May 8, 2020, now Pat. No. 11,121,194, which is a (Continued)

(30) Foreign Application Priority Data

Jan. 20, 2016 (KR) .......................... 10-2016-0006910

(51) Int. Cl.
G06F 3/041 (2006.01)
H01L 27/32 (2006.01)
(Continued)

(52) U.S. Cl.
CPC ............ *H01L 27/323* (2013.01); *G06F 3/044* (2013.01); *G06F 3/0412* (2013.01); *H01L 51/525* (2013.01)

(58) Field of Classification Search
CPC ... H01L 27/323; H01L 51/525; G06F 3/0412; G06F 3/044; G06F 3/0448; G06F 3/041
See application file for complete search history.

(56) References Cited

U.S. PATENT DOCUMENTS 8,766,531 B1 7/2014 Hack et al.
9,147,721 B2 9/2015 Hong
(Continued)

FOREIGN PATENT DOCUMENTS

CN 102541348 A 7/2012
CN 103872083 A 6/2014
(Continued)

OTHER PUBLICATIONS

Chinese Office Action Report, Application No. 201611144700.3 dated Apr. 2, 2021, 5 pages.

*Primary Examiner* — Adam R. Giesy
(74) *Attorney, Agent, or Firm* — Innovation Counsel LLP

(57) ABSTRACT

The display device may include a first substrate including a plurality of pixel areas; a plurality of display elements arranged in the plurality of pixel areas on the first substrate; a second substrate facing the first substrate; a plurality of spacers arranged between the plurality of pixel areas and maintaining a constant space between the first substrate and the second substrate; and a plurality of touch sensing electrodes arranged on a surface of the second substrate which faces the first substrate. Here, each touch sensing electrode may include at least one first area and at least one second area that is electrically separated from the first area. The plurality of spacers may be arranged to correspond to the first area.

20 Claims, 14 Drawing Sheets

Related U.S. Application Data continuation of application No. 16/262,707, filed on Jan. 30, 2019, now Pat. No. 10,651,245, which is a continuation of application No. 15/402,969, filed on Jan. 10, 2017, now Pat. No. 10,199,440.

(51) Int. Cl.
 *G06F 3/044* (2006.01)
 *H01L 51/52* (2006.01)

(56) References Cited

U.S. PATENT DOCUMENTS

| | | |
|---|---|---|
| 9,239,654 B2 | 1/2016 | Jang |
| 9,360,971 B2 | 6/2016 | Barton et al. |
| 9,647,042 B2 | 5/2017 | Li et al. |
| 9,735,210 B2 | 8/2017 | Gu et al. |
| 9,853,241 B2 | 12/2017 | Bi et al. |
| 9,997,729 B2 | 6/2018 | Chae |
| 10,013,097 B2 | 7/2018 | Choung et al. |
| 10,185,430 B2 | 1/2019 | Zhu et al. |
| 2006/0102461 A1 | 5/2006 | Cok et al. |
| 2009/0303400 A1 | 12/2009 | Hou et al. |
| 2012/0044182 A1 | 2/2012 | Seo et al. |
| 2015/0162387 A1 | 6/2015 | Gu et al. |
| 2015/0207094 A1 | 7/2015 | Hwang |
| 2017/0185180 A1 | 6/2017 | Chae |
| 2017/0185203 A1 | 6/2017 | Seong |
| 2017/0205959 A1 | 7/2017 | Seong |
| 2017/0207277 A1 | 7/2017 | Park |

FOREIGN PATENT DOCUMENTS

| | | |
|---|---|---|
| CN | 103943061 A | 7/2014 |
| CN | 104576704 A | 4/2015 |
| CN | 104750284 A | 7/2015 |
| CN | 104820510 A | 8/2015 |
| CN | 106920822 A | 7/2017 |
| JP | 2011-154797 | 8/2011 |
| JP | 2013-105453 | 5/2013 |
| KR | 10-2010-0034436 A | 4/2010 |
| KR | 10-2012-0041579 A | 5/2012 |
| KR | 10-2012-0061106 A | 6/2012 |
| KR | 10-2013-0118072 A | 10/2013 |
| KR | 10-1373044 B1 | 3/2014 |
| KR | 10-2014-0062341 A | 5/2014 |
| KR | 10-2014-0129134 A | 11/2014 |
| KR | 10-2015-0049141 A | 5/2015 |
| KR | 10-2015-0102697 A | 9/2015 |
| KR | 10-1588450 B1 | 1/2016 |
| KR | 10-2017-0075909 A | 7/2017 |
| KR | 10-2017-0087556 A | 7/2017 |
| KR | 10-2017-0087557 A | 7/2017 |

DISPLAY DEVICE

CROSS-REFERENCE TO RELATED APPLICATION

This application is a continuation application of U.S. patent application Ser. No. 16/870,623 filed on May 8, 2020, which is a continuation application of U.S. patent application Ser. No. 16/262,707 filed on Jan. 30, 2019 (now U.S. Pat. No. 10,651,245), which is a continuation application of U.S. patent application Ser. No. 15/402,969 filed on Jan. 10, 2017 (now U.S. Pat. No. 10,199,440), which claims priority to and the benefit of Korean Patent Application No. 10-2016-0006910, filed on Jan. 20, 2016, in the Korean Intellectual Property Office, the entire contents of which are incorporated herein by reference in their entirety.

BACKGROUND

1. Technical Field

The present disclosure relates to a display device.

2. Related Art

A display device including a touch screen attached to a display panel is developed. The touch screen is one of an information input device. A user may input information by pressing or touching a touch sensor on the touch screen, while watching images being displayed on the display panel.

Recently, a display device including the display panel in which the touch screen is embedded has been developed so as to make a mobile terminal such as a smart phone or a tablet computer to be slimmer.

SUMMARY

A feature of the present disclosure is to provide an all-in-one display device with touch screen which internally includes elements configuring a touch screen.

According to one embodiment of the present disclosure, a display device includes a first substrate including a plurality of pixel areas; a plurality of display elements disposed in the plurality of pixel areas on the first substrate; a second substrate facing the first substrate; a plurality of spacers disposed between the plurality of pixel areas and maintaining a constant space between the first substrate and the second substrate; and a plurality of touch sensing electrodes between the display elements and the second substrate. Here, each touch sensing electrode may include at least one first area and at least one second area that is electrically separated from the first area. The plurality of spacers may be disposed to correspond to the first area.

The second area may have a shape which surrounds the first area in a plan view.

Each of the plurality of display elements may include a first electrode disposed in the pixel area; a pixel defining layer disposed between the plurality of pixel areas and having an opening which extends to the first electrode; a light emitting layer disposed on the first electrode and including at least a light generation layer; and a second electrode disposed on the light emitting layer. The plurality of spacers may be disposed on the pixel defining layer, and the second electrode may extend to the pixel defining layer and the plurality of spacers.

The plurality of touch sensing electrodes may include a plurality of conductive fine lines intersecting each other.

The plurality of conductive fine lines may include a plurality of first lines extending in one direction; and a plurality of second lines extending in a direction intersecting the plurality of first lines. The plurality of display elements may be disposed in areas which are formed by the plurality of first lines and the plurality of second lines that are adjacent to each other and intersect each other.

The plurality of conductive fine lines may include a first conductive layer disposed on the second substrate; a first cover film disposed on the first conductive layer; and a second conductive layer disposed on the first cover film and electrically connected to the first conductive layer through a contact hole in the first cover film.

The display device may further include a second cover film covering the second conductive layer.

The plurality of conductive fine lines may be disposed only in the second area.

The display device may further include an encapsulating layer disposed on the second electrode.

A distance between the second electrode that is disposed on an upper surface of the plurality of spacers which face the second substrate and the second substrate may be 200 μm to 300 μm.

The display device may further include a filling material disposed between the first substrate and the second substrate.

The plurality of conductive fine lines in the first area may be electrically separated from the plurality of conductive fine lines in the second area.

The display device may further include an encapsulating layer disposed on the second electrode.

A distance between the second electrode that is disposed on an upper surface of the plurality of spacers which face the second substrate and the plurality of conductive fine lines may be 200 μm to 300 μm.

The display device may further include a filling material disposed between the first substrate and the second substrate.

A part of the plurality of touch sensing electrodes may configure a plurality of touch sensing electrode rows which are connected in one direction and are parallel with each other, and other touch sensing electrodes may configure a plurality of touch sensing electrode columns which are connected in a direction intersecting the plurality of touch sensing electrode rows and are parallel with each other.

The plurality of touch sensing electrodes may be arranged in a matrix form.

According to another embodiment of the present disclosure, a display device includes a substrate including a plurality of pixel areas; a plurality of first electrodes disposed in each of the plurality of pixel areas; a pixel defining layer disposed between the plurality of pixel areas and having openings which extend to the first electrodes; a light emitting layer disposed on the plurality of first electrodes and including at least one light generation layer; a plurality of spacers disposed on the pixel defining layer; a second electrode disposed on the light emitting layer, the pixel defining layer, and the plurality of spacers; a second substrate facing the first substrate; and a plurality of touch sensing electrodes between the second electrode and the second substrate.

Each touch sensing electrode may include at least one open portion and the plurality of spacers may be disposed in an area corresponding to the open portion.

According to still another embodiment of the present disclosure, a display device includes a substrate including a plurality of pixel areas; a plurality of first electrodes disposed in each of the plurality of pixel areas; a pixel defining layer disposed between the plurality of pixel areas and having openings which extend to the plurality of first electrodes; a light emitting layer disposed on the plurality of first electrodes and including at least one light generation layer; a plurality of spacers disposed on the pixel defining layer; a second electrode disposed on the light emitting layer, the pixel defining layer, and the plurality of spacers; a second substrate facing the first substrate; and a plurality of touch sensing electrodes between the second electrode and the second.

Each touch sensing electrode may internally include a separated area which is electrically separated from other areas and the plurality of conductive fine lines which are arranged in the separated area may be electrically separated from the plurality of conductive fine lines which are arranged in the other areas. The plurality of spacers may be disposed in an area corresponding to the separated area.

As described above, a display device may internally include elements which configure a touch screen. Hence, the display device can be slimmer.

DETAILED DESCRIPTION OF THE EMBODIMENTS

Hereinafter, preferred embodiments of the present disclosure will be described in detail with reference to the accompanying drawings.

Figure 1:
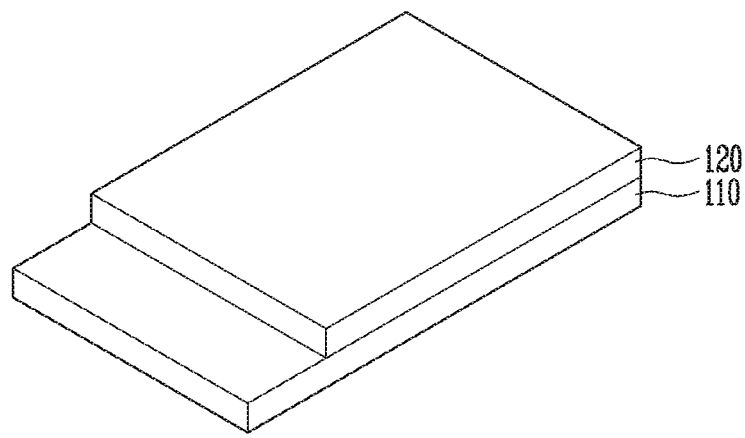
FIG. 1 is a perspective view illustrating a display device according to an example of the present disclosure.
Figure 2:
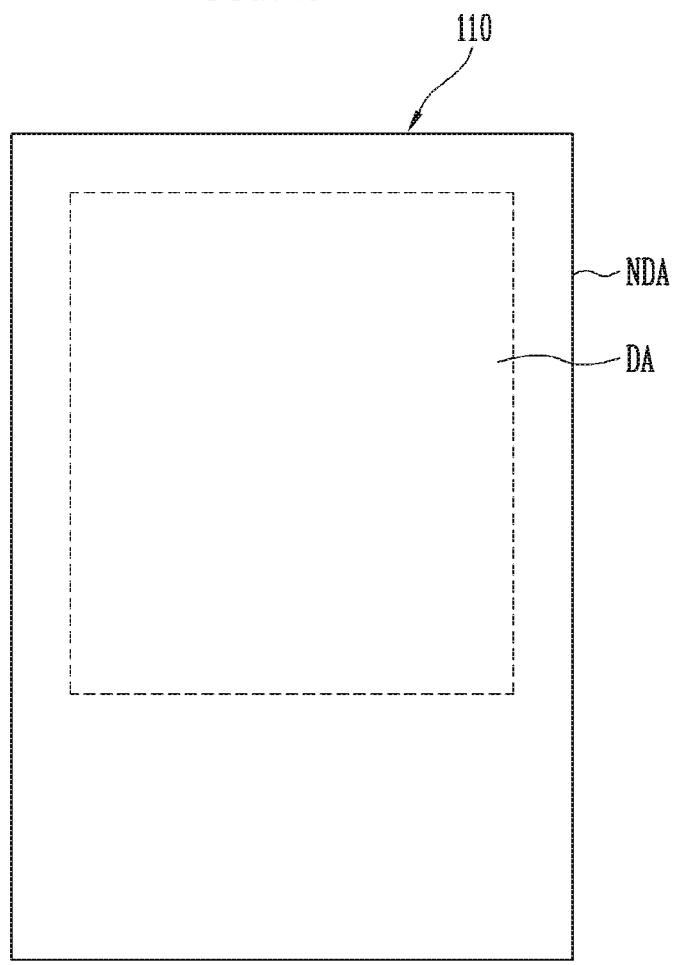
FIG. 2 is a plan view illustrating a first substrate of FIG. 1.
Figure 3:
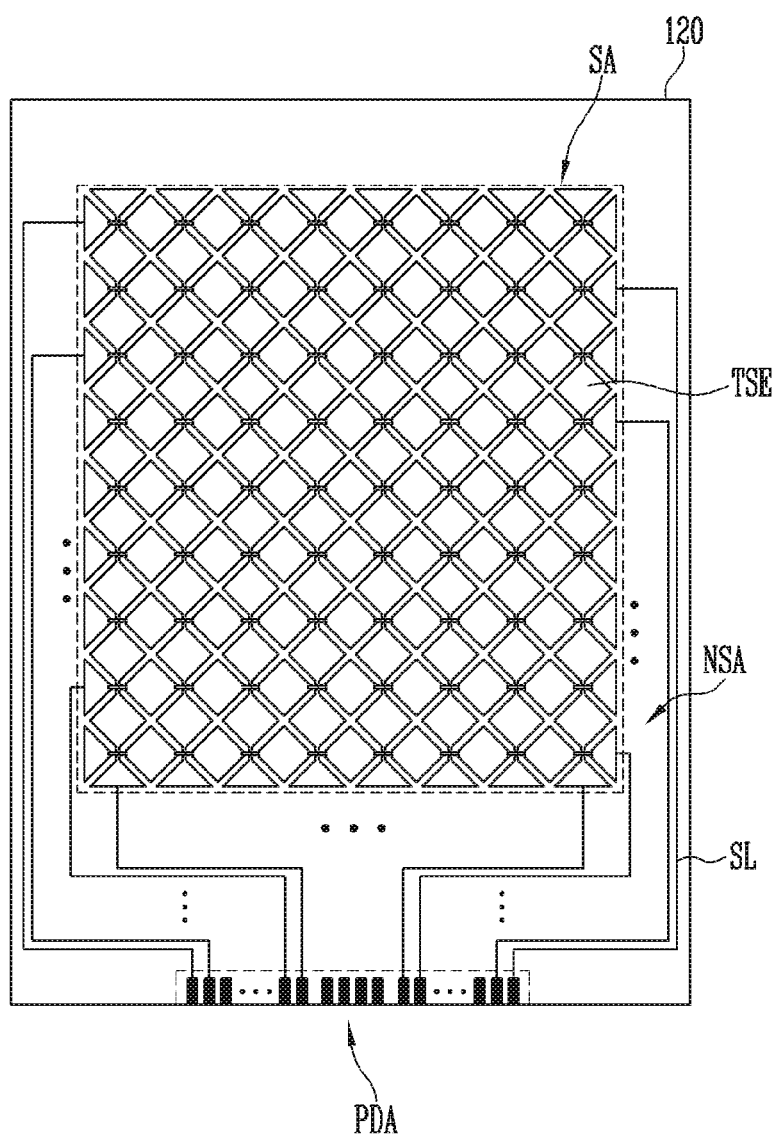
FIG. 3 and FIG. 4 are plan views illustrating a second substrate of FIG. 1.
Figure 4:
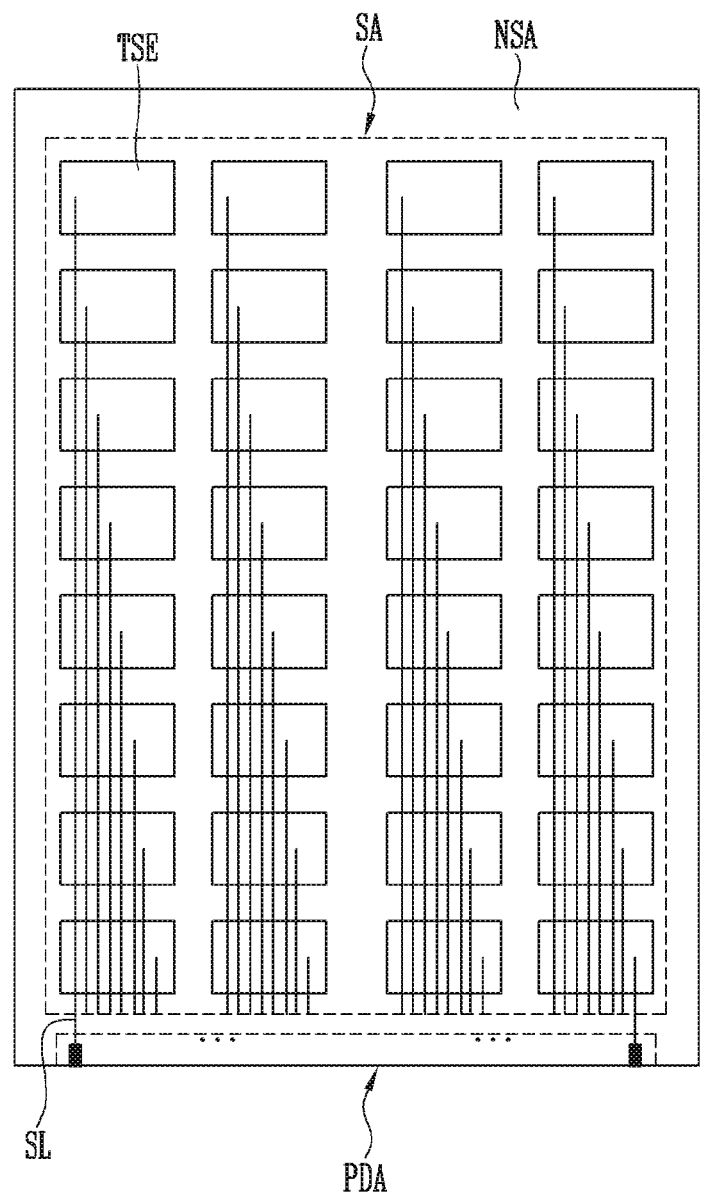

FIG. 1 is a perspective view illustrating a display device according to an example of the present disclosure, FIG. 2 is a plan view illustrating a first substrate 110 of FIG. 1, and FIG. 3 and FIG. 4 are plan views illustrating a second substrate 120 of FIG. 1.

Referring to FIG. 1 to FIG. 4, the display device may include the first substrate 110, a plurality of display elements (not illustrated) which are arranged in the first substrate 110, the second substrate 120 which faces the first substrate 110, and a plurality of touch sensing electrodes TSE that are arranged on a surface of the second substrate 120 which faces the first substrate 110.

The first substrate 110 may include a display area DA and a non-display area NDA. The display area DA may include a plurality of pixel areas. The non-display area NDA may be disposed to be adjacent to the display area DA.

In addition, the first substrate 110 may include a plurality of gate lines (not illustrated), a plurality of data lines (not illustrated) intersecting the plurality of gate lines, and a plurality of thin film transistors (not illustrated) which are connected to the plurality of gate lines and the plurality of data lines. Each display element may be connected to one of the plurality of thin film transistors.

The plurality of display elements may be arranged in the plurality of pixel areas on the first substrate 110. The plurality of display elements may be any one of a liquid crystal display (LCD) device, an electrophoretic display (EPD) device, an electrowetting display (EWD) device, and an organic light emitting display (OLED) device. Meanwhile, for the sake of convenient description, an example in which the organic light emitting display element is used for the display element will be hereinafter described.

Each of the plurality of display elements may include a first electrode which is connected to the thin film transistor, a light emitting layer which is disposed on the first electrode, and a second electrode which is disposed on the light emitting layer. The light emitting layer may include a light generation layer which generates light by recombining holes with electrons which are injected through the first electrode and the second electrode.

The second substrate 120 may include a sensing area SA and a non-sensing area NSA. The sensing area SA may correspond to the display area DA of the first substrate 110. The non-sensing area NSA may be disposed to be adjacent to the sensing area SA. In addition, the non-sensing area NSA may correspond to the non-display area NDA of the first substrate 110.

The plurality of touch sensing electrodes TSE may be arranged in the sensing area SA on a surface of the second substrate 120 which faces the first substrate 110, and may be connected to a pad portion PDA through a sensing line SL. The plurality of touch sensing electrodes TSE may be arranged in various forms according to a touch sensing type of the display device.

For example, the touch sensing type of the display device may be a mutual capacitance touch screen type, as illustrated in FIG. 3. Here, some of the plurality of touch sensing electrodes TSE may be connected in one direction, and may configure a plurality of touch sensing electrode rows parallel to each other. In addition, the other touch sensing electrodes TSE may be connected in a direction intersecting the touch sensing electrode rows, and may configure a plurality of touch sensing electrode columns parallel to each other. The touch sensing electrode rows and the touch sensing electrode columns may be respectively connected to pads of the pad portion PDA through the plurality of sensing lines SL.

In addition, the touch sensing type of the display device may be a self-capacitance touch screen type, as illustrated in FIG. 4. Here, the plurality of touch sensing electrodes TSE may be arranged in a matrix form, and the touch sensing electrode TSE may be connected the pads of the pad portion PDA through the plurality of sensing lines SL.

Figure 5:
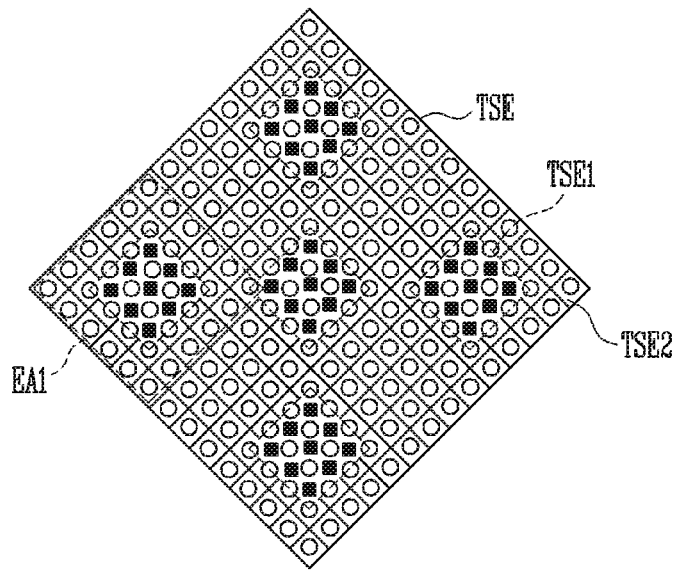
FIG. 5 is a plan view illustrating an area corresponding to a touch sensing electrode illustrated in FIG. 3.
Figure 6:
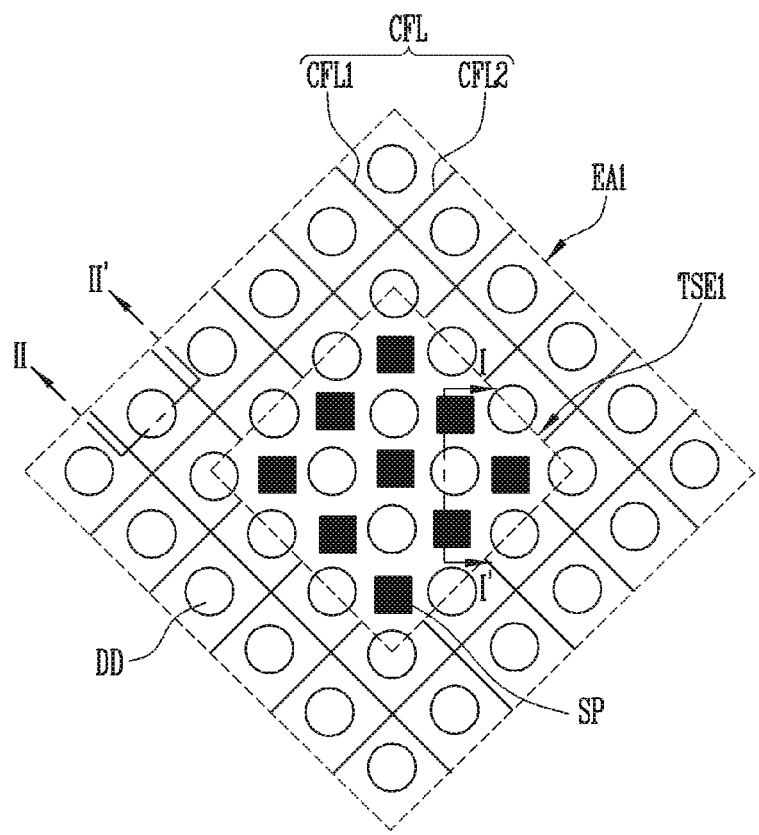
FIG. 6 is an enlarged plan view of an area EA1 of FIG. 5.
Figure 7:
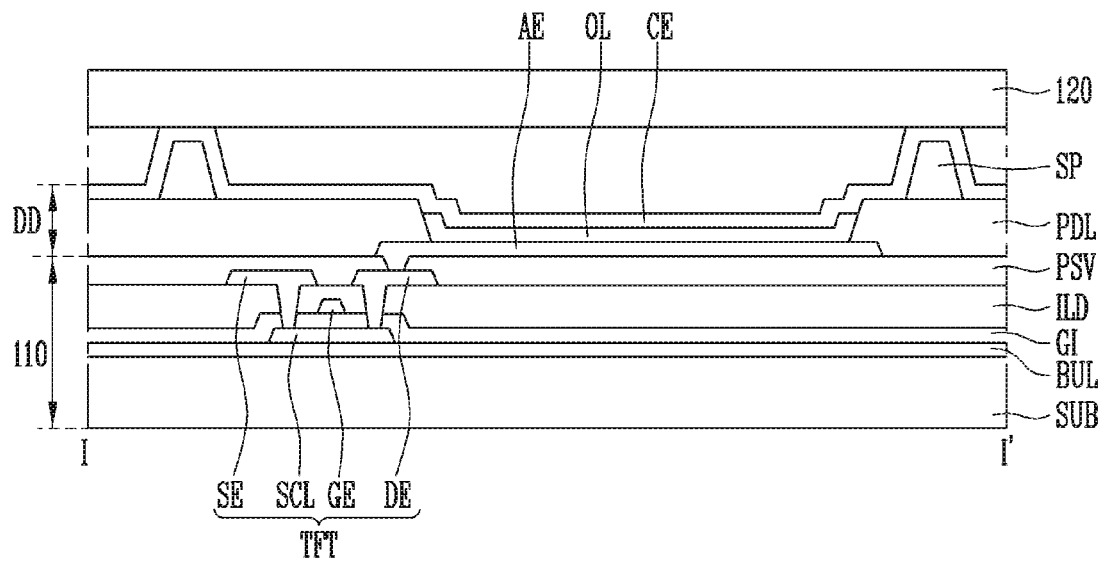
FIG. 7 is a sectional view taken along line I-I' of FIG. 6.
Figure 8:
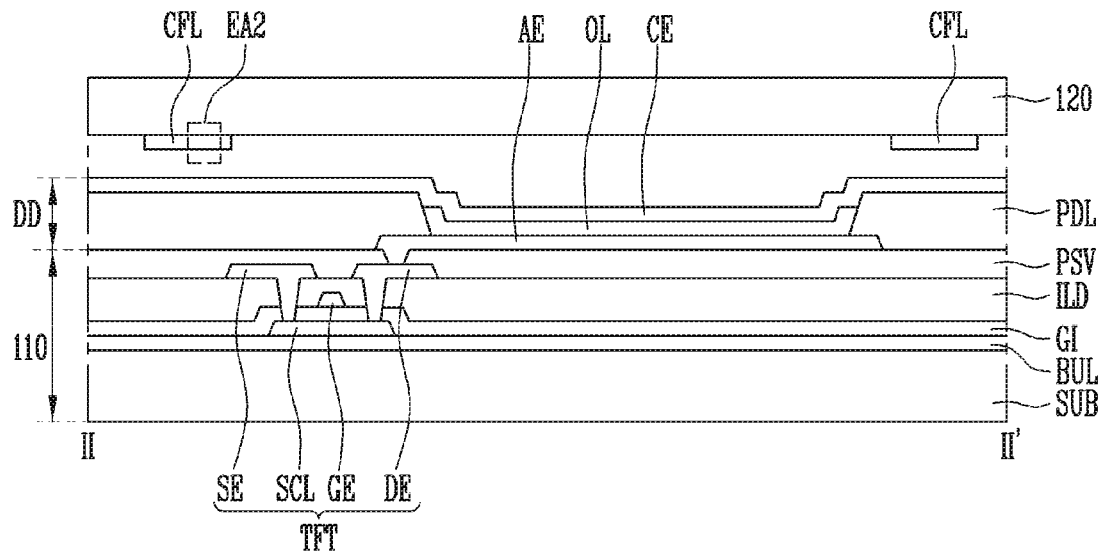
FIG. 8 is a sectional view taken along line II-II' of FIG. 6.
Figure 9:
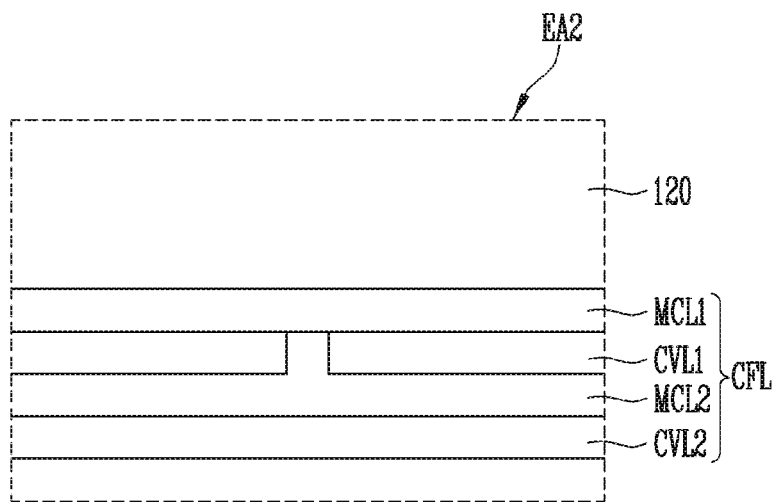
FIG. 9 is an enlarged view of an area EA2 of FIG. 8.

FIG. 5 is a plan view illustrating an area corresponding to the touch sensing electrode TSE illustrated in FIG. 3, FIG. 6 is an enlarged plan view of an area EA1 of FIG. 5, FIG. 7 is a sectional view taken along line I-I' of FIG. 6, FIG. 8 is a sectional view taken along line II-II' of FIG. 6, FIG. 9 is an enlarged view of an area EA2 of FIG. 8.

Referring to FIG. 1 to FIG. 9, a display device may include the first substrate 110, a plurality of display elements DD which are arranged on the first substrate 110, a plurality of spacers SP which are arranged between the plurality of display elements DD, the second substrate 120 which faces the first substrate 110, and the plurality of touch sensing electrodes TSE which are arranged on a surface of the second substrate 120 which faces the first substrate 110.

The first substrate 110 may include the display area DA and the non-display area NDA. The display area DA may include a plurality of pixel areas. The non-display area NDA may be disposed to be adjacent to the display area DA. In addition, the first substrate 110 may include a base substrate SUB, and at least one thin film transistor TFT which is disposed in each pixel area on the base substrate SUB.

Light may pass through the base substrate SUB which contains a transparent insulating material. In addition, the base substrate SUB may be a rigid substrate or a flexible substrate. The rigid substrate may include a glass substrate, a quartz substrate, a glass ceramic substrate and a crystalline glass substrate. The flexible substrate may include a film substrate which contains organic polymer, and a plastic substrate. For example, the flexible substrate may include any one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). In addition, the flexible substrate may include fiber glass reinforced plastic (FRP).

A material which is contained in the base substrate SUB may have resistance (or heat resistance) to high temperature when the display device is manufactured.

A buffer layer BUL may be disposed between the base substrate SUB and the thin film transistor TFT. The buffer layer BUL may include at least one of a silicon oxide and a silicon nitride. For example, the buffer layer BUL may include a first insulating film including a silicon oxide and a second insulating film which is disposed on the first insulating film and includes a silicon nitride. The buffer layer BUL may prevent impurities from diffusing into the thin film transistor TFT from the base substrate SUB. In addition, the buffer layer BUL may planarize a surface of the base substrate SUB.

The thin film transistor TFT may be connected to a gate line and a data line. The thin film transistor TFT may include a semiconductor layer SCL, a gate electrode GE, a source electrode SE, and a drain electrode DE.

The semiconductor layer SCL may be disposed on the buffer layer BUL. The semiconductor layer SCL may contain one of amorphous Si, polycrystalline Si, an oxide semiconductor, and an organic semiconductor. An area which is connected to the source electrode SE and the drain electrode DE may be respectively a source area and a drain area into which impurities are doped or injected. An area between the source electrode SE and the drain electrode DE may be a channel area.

Meanwhile, if the semiconductor layer SCL contains an oxide semiconductor, a light blocking film for blocking light which is incident on the semiconductor layer SCL may be disposed on or under the semiconductor layer SCL, while not illustrated.

A gate insulating film GI may be disposed on the semiconductor layer SCL. The gate insulating film GI may cover the semiconductor layer SCL and may insulate the semiconductor layer SCL and the gate electrode GE. The gate insulating film GI may contain at least one of a silicon oxide and a silicon nitride.

The gate electrode GE may be disposed on the gate insulating film GI. The gate electrode GE may be connected to the gate line. The gate electrode GE may contain a low resistance conductive material, and may overlap the semiconductor layer SCL.

An interlayer insulating film ILD may be disposed on the gate electrode GE. The interlayer insulating film ILD may include the same material as the gate insulating film GI. The interlayer insulating film ILD may insulate the source electrode SE, the drain electrode DE, and the gate electrode GE.

Contact holes which penetrate the gate insulating film GI and the interlayer insulating film ILD may expose the source area and the drain area of the semiconductor layer SCL.

The source electrode SE and the drain electrode DE may be disposed on the interlayer insulating film ILD so as to be separated from each other. The source electrode SE and the drain electrode DE may contain a low resistance conductive material. One end of the source electrode SE may be connected to the data line. The other end of the source electrode SE may be connected to the source area through one of the contact holes. One end of the drain electrode DE may be connected to the drain area through another contact hole. The other end of the drain electrode DE may be connected to any one of the plurality of display elements DD.

Meanwhile, the present embodiment is described by using a case where the thin film transistor TFT has a top gate structure as an example, but is not limited to this. For example, the thin film transistor TFT may have a bottom gate structure.

A protection film PSV may be disposed on the base substrate SUB in which the thin film transistor TFT is disposed. The protection film PSV may cover the thin film transistor TFT. The drain electrode DE may be exposed by removing a part of the protection film PSV.

The protection film PSV may include at least one film. For example, the protection film PSV may include an inorganic protection film and an organic protection film which is disposed on the inorganic protection film. The inorganic protection film may contain at least one of a silicon oxide and a silicon nitride. The organic protection film may include any one of acryl, polyimide (PI), polyamide (PA), and benzocyclobutene (BCB). In addition, the organic protection film may be transparent and flexible, thereby being able to planarize a lower structure by reducing roughness.

The plurality of display elements DD may be disposed on the protection film PSV. The plurality of display elements DD may include a first electrode AE which is connected to the drain electrode DE, a light emitting layer OL which is disposed on the first electrode AE, and a second electrode CE which is disposed on the light emitting layer OL.

One of the first electrode AE and the second electrode CE may be an anode, and the other electrode may be a cathode. For example, the first electrode AE may be the anode and the second electrode CE may the cathode.

In addition, at least one of the first electrode AE and the second electrode CE may be a transmission type electrode. For example, if the display element an organic light emitting element of a rear light emission type, the first electrode AE may be a transmission type electrode, and the second electrode CE may be a reflection type electrode. If the display element is an organic light emitting element of a front surface light emission type, the first electrode may be a reflection type electrode, and the second electrode may be a transmission type electrode. If the display element is an organic light emitting element of a both side light emission type, both the first electrode AE and the second electrode CE may be a transmission type electrode. The present embodiment may be described by using a case where the display element DD is an organic light emitting element of a front surface light emission type and the first electrode AE is an anode electrode, as an example.

The first electrode AE may be disposed on the protection film PSV at each pixel area. The first electrode AE may include a reflective film (not illustrated) which can reflect light, and a conductive film (not illustrated) which is disposed on an upper portion or a lower portion of the reflective film. At least one of the transparent conductive film and the reflective film may be connected to the drain electrode DE.

The reflective film may contain a material which can reflect light. For example, the reflective film may include at least one of aluminum (AL), silver (Ag), chrome (Cr), molybdenum (Mo), platinum (Pt), nickel (Ni), and an alloy of those.

The transparent conductive film may include a transparent conductive oxide. For example, the transparent conductive film may contain at least one transparent conductive oxide of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

A pixel defining layer PDL may be disposed on the first electrode AE. The pixel defining layer PDL may be dispose between the plurality of pixel areas, and may include an open portion, sometime called openings, which extends to and exposes the first electrode AE. In addition, the pixel defining layer PDL may overlap an edge portion of the first electrode AE. Hence, the open portion of the pixel defining layer PDL may expose the most part of a surface of the first electrode AE which faces the second substrate 120.

The pixel defining layer PDL may contain an organic insulating material. For example, the pixel defining layer PDL may contain at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, silane based resin.

The plurality of spacers SP may be arranged on the pixel defining layer PDL. The plurality of spacers SP may maintain a constant space between the first substrate 110 and the second substrate 120. Even if external pressure is applied to the first substrate 110 or the second substrate 120, the plurality of spacers SP may prevent the plurality of display elements DD from being damaged since the second substrate 120 is prevented from coming into contact with the plurality of display elements DD.

The spacer SP may contain an organic insulating material. For example, the spacer SP may contain the same material as the pixel defining layer PDL.

The light emitting layer OL may be disposed on a surface of the first electrode AE which is exposed by the open portion of the pixel defining layer PDL. The light emitting layer OL may have a multilayer thin film structure including at least a light generation layer (LGL). For example, the light emitting layer OL may include a hole injection layer (HIL) into which holes are injected, a hole transport layer (HTL) which has excellent transportability and increases opportunity for recombination of holes and electrons by suppressing movement of the electrons that are not combined in the light generation layer, the light generation layer which emits light by recombination of electrons and holes which are injected, a hole blocking layer (HBL) which suppresses movement of holes which are not combined in the light generation layer, an electron transport layer which smoothly transports electrons to the light generation layer, and an electron injection layer (EIL) which injects electrons.

A color of light which is generated in the light generation layer may be any one of red, green, blue, and white, and the present embodiment is not limited to this. For example, a color of light which is generated in the light generation layer of the light emitting layer OL may be one of magenta, cyan, and yellow.

The hole injection layer, the hole transport layer, the hole blocking layer, the electron transport layer, and the electron injection layer may be a common film which is connected to each other at adjacent pixel areas.

The second electrode CE may be disposed on the light emitting layer OL. In addition, the second electrode CE may extend to the pixel defining layer PDL and the plurality of spacers SP.

The second electrode CE may be a transflective film. For example, the second electrode CE may be a thin metal layer with a thickness that light can transmit. A part of light which is generated in the light generation layer may transmit through the second electrode CE and the other light from the light generation layer may be reflected from the second electrode CE.

The second electrode CE may contain a material with a work function lower than that of the transparent conductive film of the first electrode AE. For example, the second electrode CE may contain at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and an alloy of those.

A part of light which is emitted from the light emitting layer OL may not transmit through the second electrode CE and light reflected from the second electrode CE may be reflected from the reflective film of the first electrode AE. That is, light which is emitted from the light emitting layer OL may be resonate between the reflective film of the first electrode AE and the second electrode CE. Light extraction efficiency of the plurality of display elements DD may be increased by the resonance of light.

A distance between the reflective film of the first electrode AE and the second electrode CE may differ according to a color of light which is generated in the light generation layer of the light emitting layer OL. That is, the distance between the reflective film of the first electrode AE and the second electrode CE may be adjusted to be consistent with a resonance distance in accordance with the color of light which is generated in the light generation layer of the light emitting layer OL.

The second substrate 120 may separate the plurality of display elements DD from an external environment. In addition, the second substrate 120 may contain the same material as the base substrate SUB. The second substrate 120 may adhere to the first substrate 110 by a sealant.

The second substrate 120 may include the sensing area SA, and the non-sensing area NSA which is disposed to be adjacent to the sensing area SA. The sensing area SA may correspond to the display area DA of the first substrate 110. The non-sensing area NSA may be disposed to be adjacent to the sensing area SA. In addition, the non-sensing area NSA may correspond to the non-display area NDA of the first substrate 110.

The touch sensing electrode TSE may be disposed between the second electrode CE of the display elements DD and the second substrate 120 in the sensing area SA. For example, the touch sensing electrode TSE may be disposed in the sensing area SA on a surface of the second substrate 120 which faces the first substrate 110.

The touch sensing electrode TSE may include at least one first area TSE1 and a second area TSE2 which is electrically separated from the first area TSE1. The first area TSE1 may be electrically separated. In addition, the second area TSE2 may have a shape which surrounds the first area TSE1, in a plan view. That is, the first area TSE1 may have an island shape which is separated within the second area TSE2.

The plurality of touch sensing electrodes TSE may include a metal mesh. In detail, the plurality of touch sensing electrodes TSE may include a plurality of conductive fine lines CFL intersecting each other. The plurality of conductive fine lines CFL may include a plurality of first lines CFL1 which extend in one direction, and a plurality of second lines CFL2 which extend in a direction intersecting, e.g., perpendicularly, the plurality of first lines CFL1.

The conductive fine line CFL may include at least one conductive layer. For example, the conductive fine line CFL may include a single conductive layer including at least one of Ag, Al, Cu, Vr, Ni, Au, and an alloy of those.

In addition, the conductive fine line CFL may include a plurality of conductive layers which are stacked. For example, the conductive fine line CFL may include a first conductive layer MCL1 which is disposed on the second substrate 120, a first cover film CVL1 which covers the first conductive layer MCL1, and a second conductive layer MCL2 which is disposed on the first cover film CVL1.

The first conductive layer MCL1 and the second conductive layer MCL2 may respectively contain a material with high conductivity. For example, the first conductive layer MCL1 and the second conductive layer MCL2 may contain at least one of Ag, Al, Cu, Vr, Ni, Au, and an alloy of those. The first conductive layer MCL1 and the second conductive layer MCL2 may be electrically connected to each other through a contact hole formed in the first cover film CVL1.

In addition, a second cover film CVL2 may be disposed on the second conductive layer MCL2.

The first cover film CVL1 and the second cover film CVL2 may respectively contain an insulating material. For example, the first cover film CVL1 and the second cover film CVL2 may contain at least one of a silicon oxide and a silicon nitride.

As described above, the conductive fine line CFL may include the first conductive layer MCL1 and the second conductive layer MCL2 which are electrically connected to each other. Accordingly, resistance of the conductive fine line CFL may be reduced.

An area which is formed by the plurality of first lines CFL1 with the plurality of second lines CFL2 may correspond to the pixel area. That is, the plurality of display elements DD may be arranged in an area which is formed by intersecting the plurality of first lines CFL1 with the plurality of second lines CFL2.

The conductive fine line CFL may be disposed only in the second area TSE2. The plurality of conductive fine lines CFL may not be arranged in the first area TSE1. That is, the first area TSE1 may be an open portion which is disposed in the touch sensing electrode TSE.

Meanwhile, the plurality of spacers SP may be arranged only in an area corresponding to the first area TSE1, and may not be arranged in an area corresponding to the second area TSE2. In addition, the plurality of conductive fine lines CFL which are included in the touch sensing electrode TSE may not be arranged in the first area TSE1. Hence, it is possible to prevent a parasitic capacitor from being formed between the second electrode CE that is disposed on an upper surface of the spacer SP which faces the second substrate 120 and the conductive fine line CFL.

If the plurality of conductive fine lines CFL are arranged in the first area TSE1, the second electrode CE and the conductive fine line CFL may come into contact with each other. If the second electrode CE and the conductive fine line CFL may come into contact with each other, touching the display device may not be performed.

In addition, if the conductive fine line CFL is disposed in the first area TSE1, a parasitic capacitor may be formed between the second electrode CE and the conductive fine line CFL. A distance between the second electrode CE that is disposed on the upper surface of the spacer SP which faces the second substrate 120 and the conductive fine line CFL may be much shorter than a distance between the second electrode CE and the conductive fine line CFL in an area other than the area in which the plurality of spacers SP are arranged. Hence, parasitic capacitance of the parasitic capacitor which is formed between the second electrode CE that is disposed on the upper surface of the spacer SP which faces the second substrate 120 and the conductive fine line CFL may be much larger than parasitic capacitance of a parasitic capacitor which is formed between the second electrode CE and the conductive fine line CFL in an area other than the area in which the plurality of spacers SP are arranged. The parasitic capacitor may reduce touch sensitivity of the display device.

Hereinafter, another embodiment of the present disclosure will be described with reference to FIG. 10 to FIG. 16. In FIG. 10 to FIG. 16, the same symbols or reference numerals will be attached to the same configuration elements as in FIG. 1 to FIG. 8, and description thereof will be briefly made. In addition, in order to avoid repetitive description thereof, different points from those of FIG. 1 to FIG. 8 will be mainly described.

Figure 10:
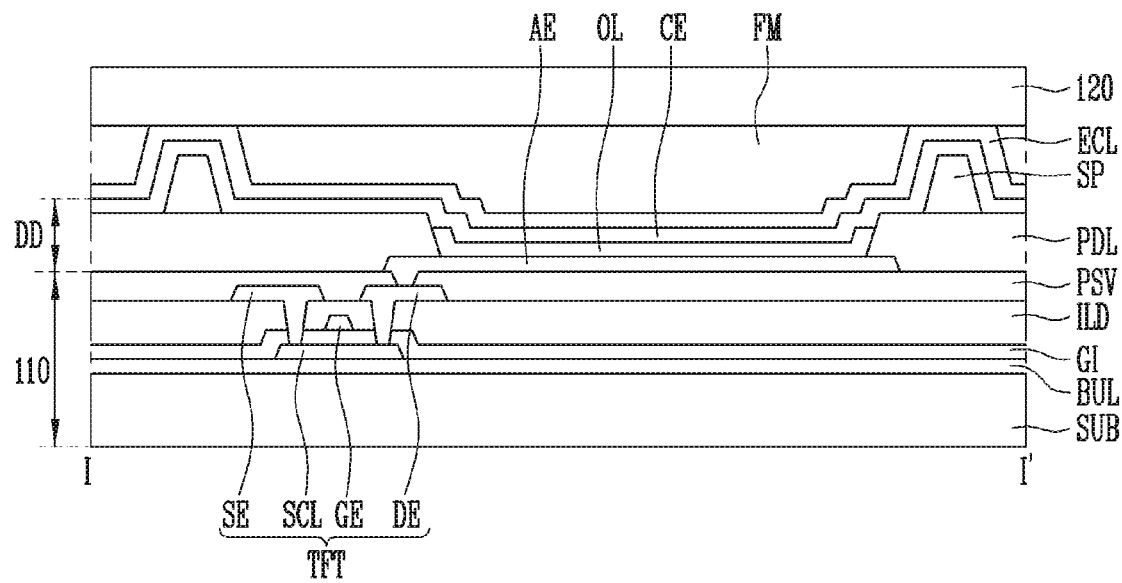
FIG. 10 and FIG. 11 are sectional views illustrating a display device according to another embodiment of the present disclosure.
Figure 11:
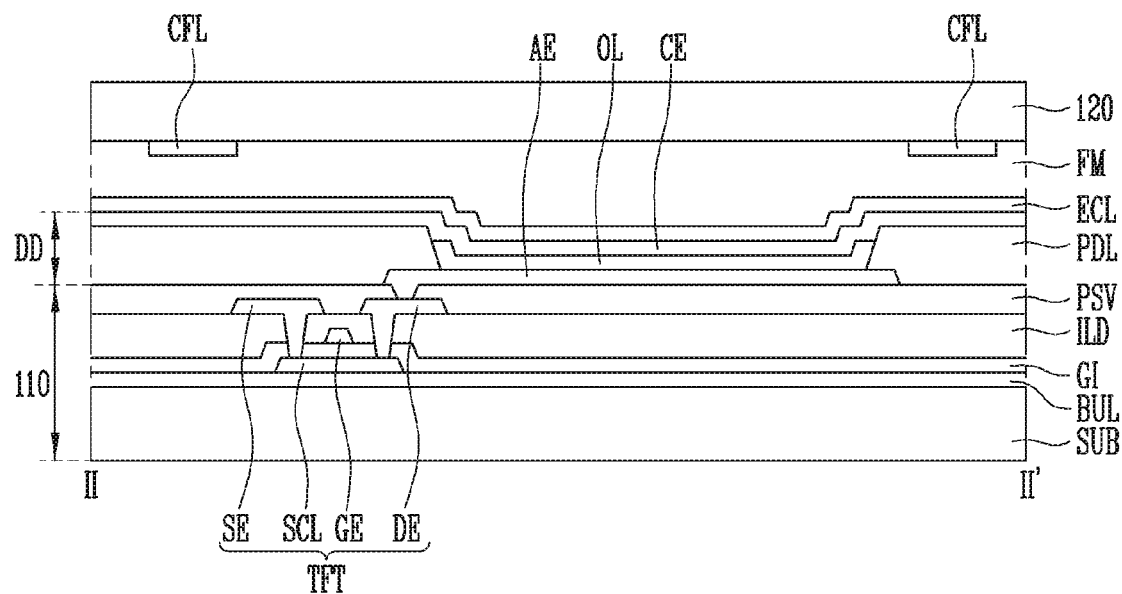

FIG. 10 and FIG. 11 are sectional views illustrating a display device according to another embodiment of the present disclosure. FIG. 10 is a sectional view taken along line I-I' of FIG. 6 and FIG. 11 is a sectional view taken along line II-II' of FIG. 6.

Referring to FIG. 1 to FIG. 6, and FIG. 10 and FIG. 11, the display device may include the first substrate 110, the plurality of display elements DD which are arranged on the first substrate 110, the plurality of spacers SP which are arranged between the plurality of display elements DD, the second substrate 120 which faces the first substrate 110, and the plurality of touch sensing electrodes TSE which are arranged on a surface of the second substrate 120 which faces the first substrate 110.

The first substrate 110 may include the display area DA and the non-display area NDA. The display area DA may include a plurality of pixel areas. The non-display area NDA may be disposed to be adjacent to the display area DA. In addition, the first substrate 110 may include the base substrate SUB, and at least one thin film transistor TFT which is disposed in each pixel area on the base substrate SUB.

The protection film PSV may be disposed on the base substrate SUB in which the thin film transistor TFT is disposed. That is, the protection film PSV may cover the thin film transistor TFT.

The plurality of display elements DD and the plurality of spacers SP may be arranged on the protection film PSV. The plurality of display elements DD may include the first electrode AE which is connected to the thin film transistor TFT, the pixel defining layer PDL which exposes the first electrode AE, the light emitting layer OL which is disposed on the first electrode AE that is exposed by the pixel defining layer PDL, and the second electrode CE which is disposed on the light emitting layer OL. The plurality of spacers SP may be arranged on the pixel defining layer PDL. The second electrode CE may extend to the pixel defining layer PDL and the plurality of spacers SP. The plurality of spacers SP may maintain a constant space between the first substrate 110 and the second substrate 120.

A filling material FM may be disposed between the first substrate 110 and the second substrate 120. The filling material FM may contain a material which can reduce external shock or external pressure. For example, the filling material FM may contain polymer. The filling material FM may prevent the first substrate 110 or the second substrate 120 from being damaged due to the external shock or the external pressure. In addition, the filling material FM may prevent the plurality of display elements DD from being damaged due to the external shock or the external pressure.

The second substrate 120 may include the sensing area SA and a non-sensing area NSA which is disposed to be adjacent to the sensing area SA. The sensing area SA may correspond to the display area DA of the first substrate 110. The non-sensing area NSA may be disposed to be adjacent to the sensing area SA. In addition, the non-sensing area NSA may correspond to the non-display area NDA of the first substrate 110.

The touch sensing electrode TSE may be disposed between the second electrode CE of the display elements DD and the second substrate 120 in the sensing area SA. For example, the plurality of touch sensing electrodes TSE may be arranged in the sensing area SA on a surface of the second substrate 120 which faces the first substrate 110.

The touch sensing electrode TSE may include at least one first area TSE1 and the second area TSE2 which is separated from the first area TSE1. The second area TSE2 may have a shape which surrounds the first area TSE1. That is, the first area TSE1 may have an island shape which is separated within the second area TSE2.

The plurality of touch sensing electrodes TSE may include a plurality of conductive fine lines CFL intersecting each other. In addition, the plurality of conductive fine lines CFL may be arranged only in the second area TSE2. That is, the plurality of conductive fine lines CFL may not be arranged in the first area TSE1.

The plurality of spacers SP may be arranged only in an area corresponding to the first area TSE1, and may not be arranged in an area corresponding to the second area TSE2.

Meanwhile, an encapsulating layer ECL may be disposed on the second electrode CE. The encapsulating layer ECL may prevent oxygen and moisture from penetrating into the plurality of display elements DD.

The encapsulating layer ECL may include a plurality of inorganic films (not illustrated) and a plurality of organic films (not illustrated). For example, the encapsulating layer ECL may include a plurality of unit encapsulating layers, each including the inorganic film and the light generation layer disposed on the inorganic film. In addition, the inorganic film may be disposed on a lowermost portion and an uppermost portion of the encapsulating layer ECL. The inorganic film may contain at least one of a silicon oxide, a silicon nitride, a silicon oxynitride, an aluminum oxide, a titanium oxide, a zirconium oxide, and a tin oxide. A thickness of the encapsulating layer ECL may be 200 μm to 300 μm. A distance between the second electrode CE that is disposed on an upper surface of the spacer SP which faces the second substrate 120 and the second substrate 120 may be 200 μm to 300 μm.

Even if a conductor may be disposed in the first area TSE1, the encapsulating layer ECL separates the second electrode CE, which is disposed on an upper surface of the plurality of spacers SP which face the second substrate 120, from the conductor, and thereby, parasitic capacitance of a parasitic capacitor may be reduced.

Figure 12:
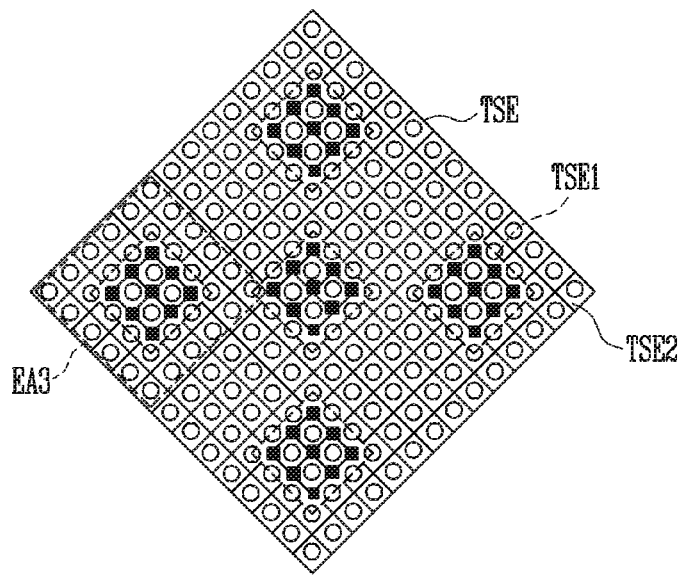
FIG. 12 is a partial plan view illustrating a display device according to still another embodiment of the present disclosure.
Figure 13:
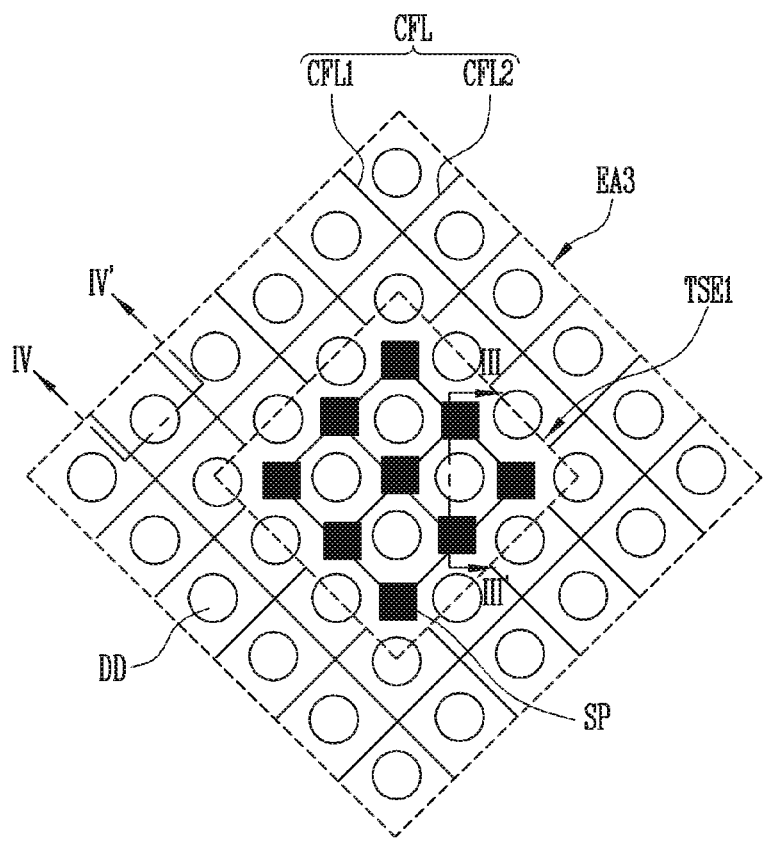
FIG. 13 is an enlarged plan view of an area EA3 of FIG. 12.
Figure 14:
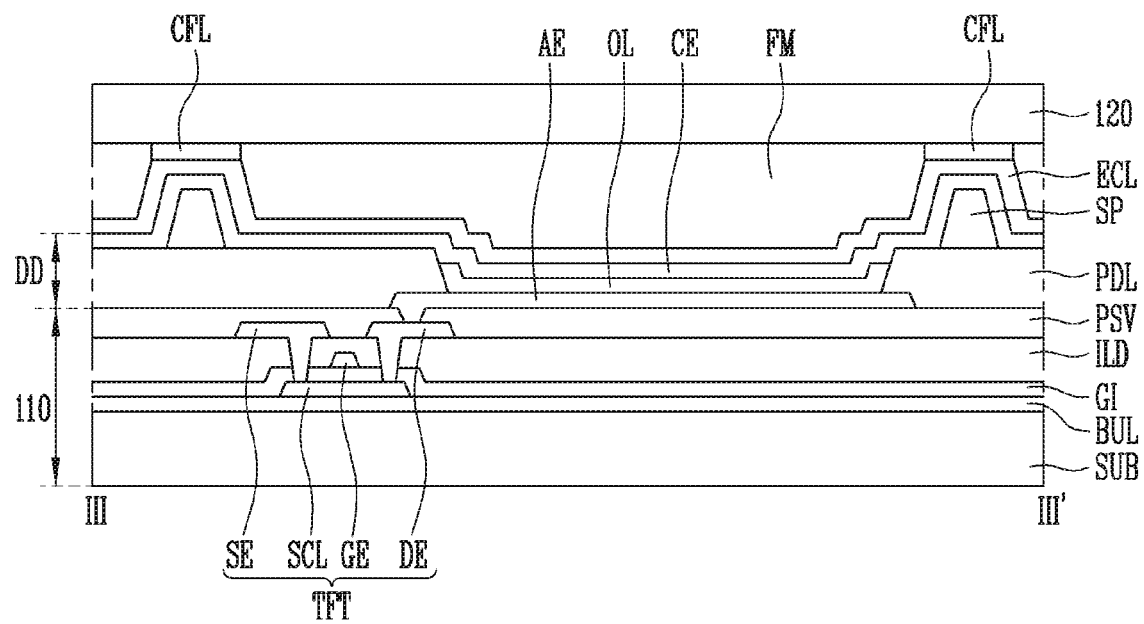
FIG. 14 is a sectional view taken along line III-III' of FIG. 13.
Figure 15:
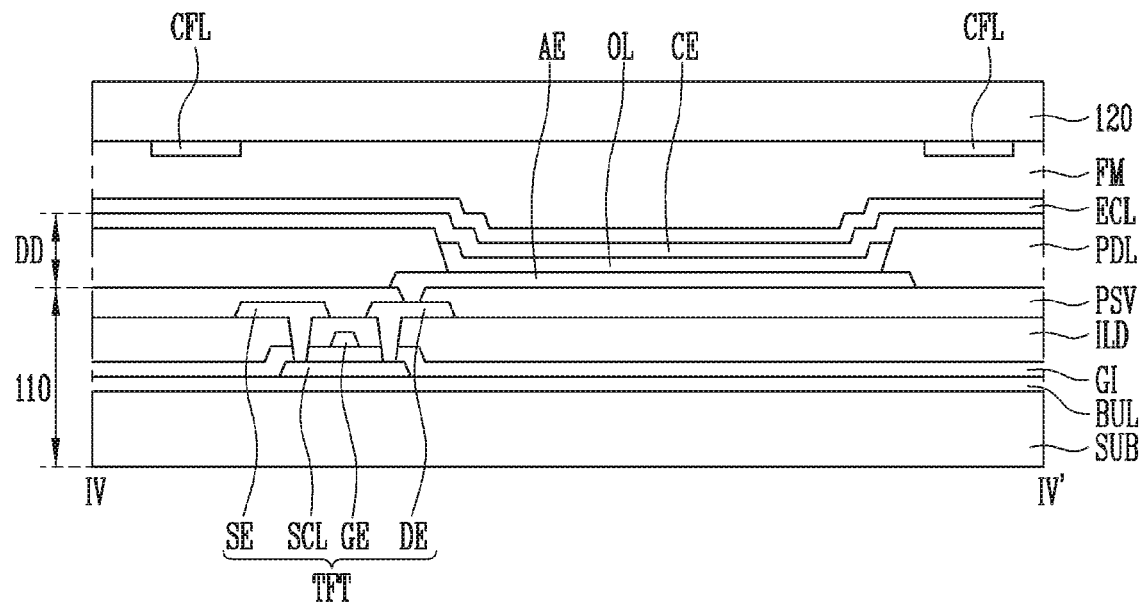
FIG. 15 is a sectional view taken along line IV-IV' of FIG. 13.

FIG. 12 is a partial plan view illustrating a display device according to still another embodiment of the present disclosure, FIG. 13 is an enlarged plan view of an area EA3 of FIG. 12, FIG. 14 is a sectional view taken along line III-III' of FIG. 13, and FIG. 15 is a sectional view taken along line IV-IV' of FIG. 13.

Referring to FIG. 1 to FIG. 4, and FIG. 12 to FIG. 15, a display device may include the first substrate 110, the plurality of display elements DD which are arranged on the first substrate 110, the plurality of spacers SP which are arranged between the plurality of display elements DD, the second substrate 120 which faces the first substrate 110, and the plurality of touch sensing electrodes TSE that are arranged on a surface of the second substrate 120 which faces the first substrate 110.

The first substrate 110 may include the display area DA and the non-display area NDA. The display area DA may include a plurality of pixel areas. The non-display area NDA may be disposed to be adjacent to the display area DA. In addition, the first substrate 110 may include the base substrate SUB, and at least one thin film transistor TFT which is disposed in each pixel area on the base substrate SUB.

The protection film PSV may be disposed on the base substrate SUB in which the thin film transistor TFT is disposed.

The plurality of display elements DD may be arranged on the protection film PSV. The plurality of display elements DD may include the first electrode AE which is connected to the thin film transistor TFT, the pixel defining layer PDL which exposes the first electrode AE, the light emitting layer OL which is disposed on the first electrode AE that is exposed by the pixel defining layer PDL, and the second electrode CE which is disposed on the light emitting layer OL. The plurality of spacers SP may be arranged on the pixel defining layer PDL. The second electrode CE may extend to the pixel defining layer PDL and the plurality of spacers SP. The spacer SP may maintain a constant space between the first substrate 110 and the second substrate 120.

The encapsulating layer ECL may be disposed on the second electrode CE. The encapsulating layer ECL may include a plurality of inorganic films (not illustrated) and a plurality of organic films (not illustrated). A thickness of the encapsulating layer ECL may be 200 μm to 300 μm.

A filling material FM may be disposed between the first substrate 110 and the second substrate 120. The filling material FM may fill the space between the first substrate 110 and the second substrate 120, and thereby external shock which is applied to the first substrate 110 or the second substrate 120 may be reduced.

The second substrate 120 may include the sensing area SA and the non-sensing area NSA which is disposed to be adjacent to the sensing area SA. The sensing area SA may correspond to the display area DA of the first substrate 110. The non-sensing area NSA may be disposed to be adjacent to the sensing area SA. In addition, the non-sensing area NSA may correspond to the non-display area NDA of the first substrate 110.

The touch sensing electrode TSE may be disposed between the second electrode CE of the display elements DD and the second substrate 120 in the sensing area SA. For example, the plurality of touch sensing electrodes TSE may be arranged in the sensing area SA on a surface of the second substrate 120 which faces the first substrate 110.

The touch sensing electrode TSE may include at least one first area TSE1 and the second area TSE2 which is electrically separated from the first area TSE1. The first area TSE1 may be electrically separated. In addition, the second area TSE2 may have a shape which surrounds the first area TSE1 in a plan view. That is, the first area TSE1 may have an island shape which is separated within the second area TSE2.

The plurality of touch sensing electrodes TSE may include the plurality of conductive fine lines CFL intersecting each other. The plurality of conductive fine lines CFL may include the plurality of first lines CFL1 which extend in one direction, and the plurality of second lines CFL2 which extend in a direction intersecting the plurality of first lines CFL1.

Meanwhile, the plurality of conductive fine lines CFL which are arranged in the first area TSE1 may be electrically separated from the plurality of conductive fine lines CFL which are arranged in the second area TSE2. That is, the plurality of conductive fine lines CFL which are arranged in the first area TSE1 may be in a state of being electrically separated from each other.

Meanwhile, the plurality of spacers SP may be arranged only in an area corresponding to the first area TSE1, and may not be arranged in an area corresponding to the second area TSE2. In addition, the plurality of conductive fine lines CFL which are arranged in the first area TSE1 may be electrically separated from each other. Hence, it is possible to prevent a parasitic capacitor from being formed between the second electrode CE that is disposed on a surface of the spacer SP which faces the second substrate 120 and the conductive fine line CFL.

In addition, since a thickness of the encapsulating layer ECL may be 200 μm to 300 μm, a distance between the second electrode CE that is disposed on an upper surface of the spacer SP and the conductive fine line CFL of the touch sensing electrode TSE may be 200 μm to 300 μm. Hence, parasitic capacitance of the parasitic capacitor can be reduced by the distance between the second electrode CE that is disposed on an upper surface of the spacer SP and the conductive fine line CFL of the touch sensing electrode TSE.

Figure 16:
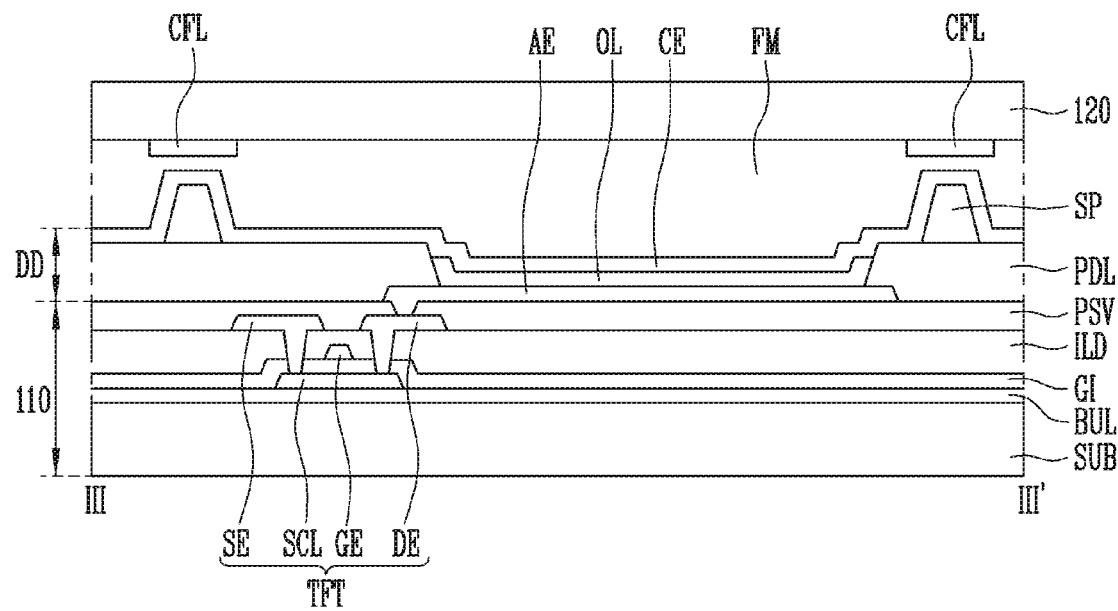
FIG. 16 and FIG. 17 are sectional views illustrating a display device according to still another embodiment of the present disclosure.
Figure 17:
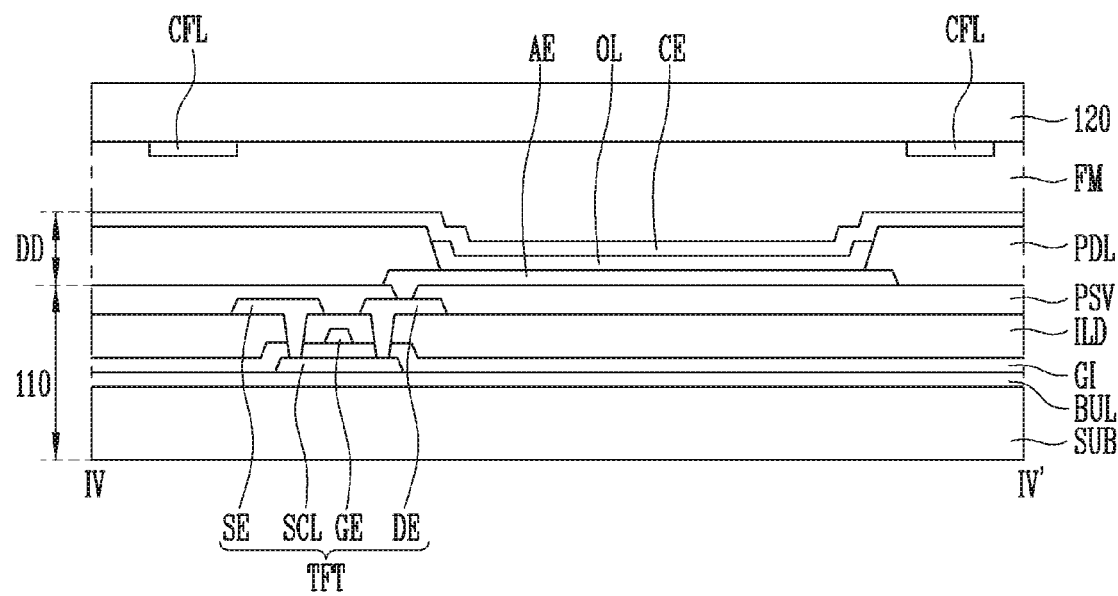

FIG. 16 and FIG. 17 are sectional views illustrating a display device according to still another embodiment of the present disclosure. FIG. 16 is a sectional view taken along line III-III' of FIG. 13, and FIG. 17 is a sectional view taken along line IV-IV' of FIG. 13.

Referring to FIG. 1 to FIG. 4, FIG. 12, FIG. 13, FIG. 16 and FIG. 17, the display device may include the first substrate 110, the plurality of display elements DD which are arranged on the first substrate 110, the plurality of spacers SP which are arranged between the plurality of display elements DD, the second substrate 120 which faces the first substrate 110, and the plurality of touch sensing electrodes TSE which are arranged on a surface of the second substrate 120 which faces the first substrate 110.

The first substrate 110 may include the display area DA and the non-display area NDA. The display area DA may include a plurality of pixel areas. The non-display area NDA may be disposed to be adjacent to the display area DA. In addition, the first substrate 110 may include the base substrate SUB, and at least one thin film transistor TFT which is disposed in each pixel area on the base substrate SUB.

The protection film PSV may be disposed on the base substrate SUB in which the thin film transistor TFT is disposed.

The plurality of display elements DD may be arranged on the protection film PSV. The plurality of display elements DD may include the first electrode AE which is connected to the thin film transistor TFT, the pixel defining layer PDL which exposes the first electrode AE, the light emitting layer OL which is disposed on the first electrode AE that is exposed by the pixel defining layer PDL, and the second electrode CE which is disposed on the light emitting layer OL. The plurality of spacers SP may be arranged on the pixel defining layer PDL. The second electrode CE may extend to the pixel defining layer PDL and the plurality of spacers SP. The plurality of spacers SP may maintain a constant space between the first substrate 110 and the second substrate 120.

The second substrate 120 may include the sensing area SA and a non-sensing area NSA which is disposed to be adjacent to the sensing area SA. The sensing area SA may correspond to the display area DA of the first substrate 110. The non-sensing area NSA may be disposed to be adjacent to the sensing area SA. In addition, the non-sensing area NSA may correspond to the non-display area NDA of the first substrate 110.

The touch sensing electrode TSE may be disposed between the second electrode CE of the display elements DD and the second substrate 120 in the sensing area SA. For example, the plurality of touch sensing electrodes TSE may be arranged in the sensing area SA on a surface of the second substrate 120 which faces the first substrate 110.

The touch sensing electrode TSE may include at least one first area TSE1 and the second area TSE2 which is separated from the first area TSE1. The second area TSE2 may have a shape which surrounds the first area TSE1. That is, the first area TSE1 may have an island shape which is separated within the second area TSE2.

The plurality of touch sensing electrodes TSE may include a plurality of conductive fine lines CFL intersecting each other. The plurality of conductive fine lines CFL which are arranged in the first area TSE1 may be electrically separated from the plurality of conductive fine lines CFL which are arranged on the second area TSE2. That is, the plurality of conductive fine lines CFL which are arranged in the first area TSE1 may be electrically separated from each other.

The filling material FM may be disposed between the first substrate 110 and the second substrate 120. The filling material FM may fill the space between the first substrate 110 and the second substrate 120, and thereby external shock which is applied to the first substrate 110 or the second substrate 120 may be reduced.

In addition, the filling material FM may maintain a constant space between the first substrate 110 and the second substrate 120. Particularly, the filling material FM may maintain a distance between the second electrode CE which is disposed on an upper surface of the spacer SP and the plurality of conductive fine lines CFL of the plurality of touch sensing electrodes TSE as 200 μm to 300 μm.

Figure 18:
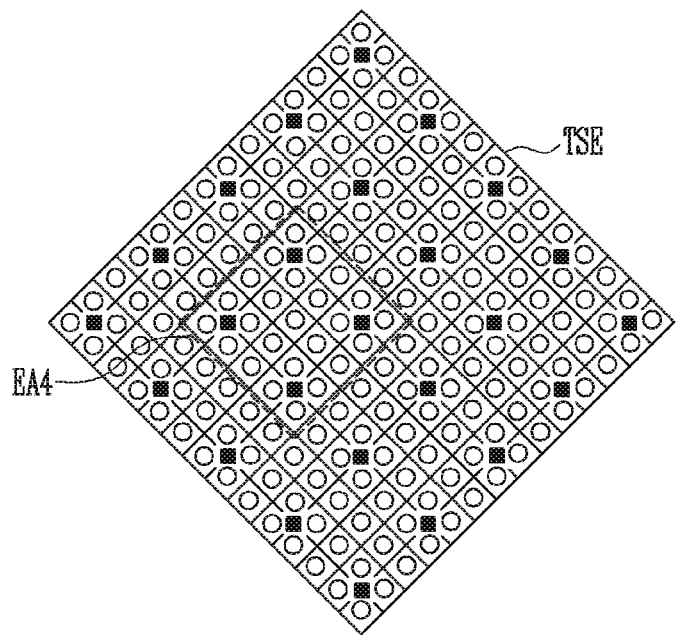
FIG. 18 is a partial plan view illustrating a display device according to still another embodiment of the present disclosure.
Figure 19:
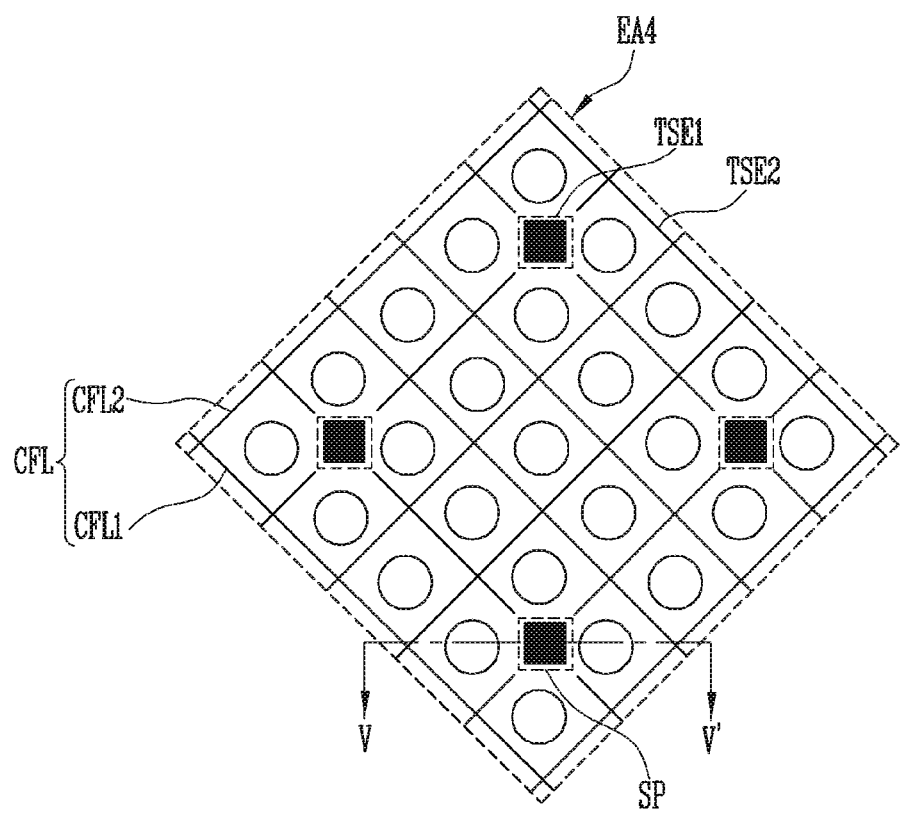
FIG. 19 is an enlarged plan view of an area EA4 of FIG. 18.
Figure 20:
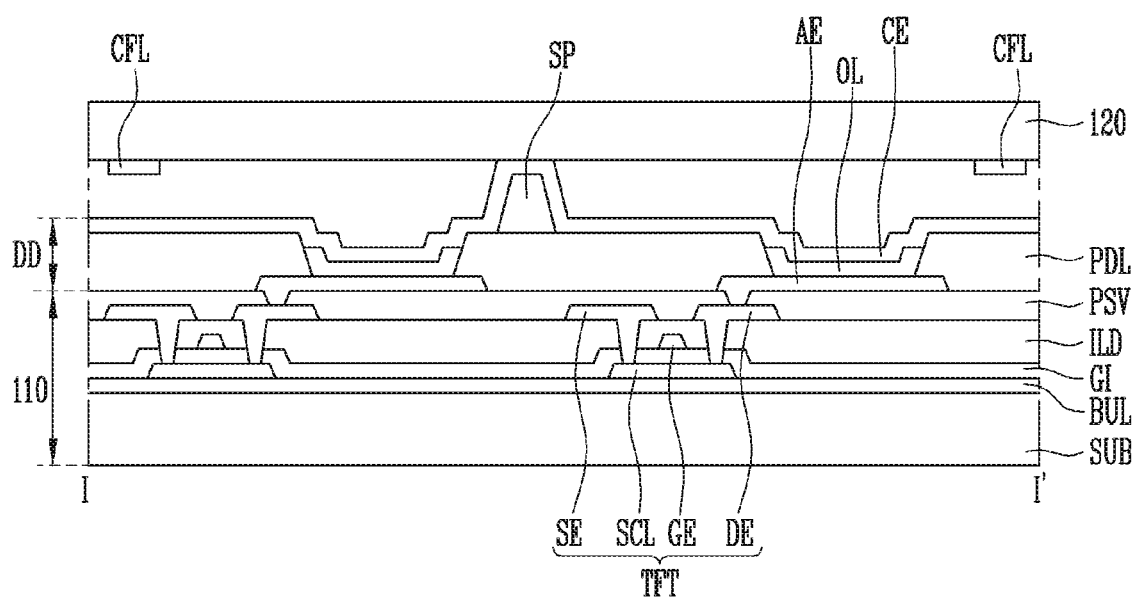
FIG. 20 is a sectional view taken along line V-V' of FIG. 19.

Parasitic capacitance of a parasitic capacitor can be reduced by the distance between the second electrode CE which is disposed on the upper surface of the spacer SP and the plurality of conductive fine lines CFL of the plurality of touch sensing electrodes TSE FIG. 18 is a partial plan view illustrating a display device according to still another embodiment of the present disclosure, FIG. 19 is an enlarged plan view of an area EA4 of FIG. 18, and FIG. 20 is a sectional view taken along line V-V' of FIG. 19.

Referring to FIG. 1 to FIG. 4, and FIG. 18 to FIG. 20, a display device may include the first substrate 110, the plurality of display elements DD which are arranged on the first substrate 110, the plurality of spacers SP which are arranged between the plurality of display elements DD, the second substrate 120 which faces the first substrate 110, and the plurality of touch sensing electrodes TSE that are arranged on a surface of the second substrate 120 which faces the first substrate 110.

The first substrate 110 may include the display area DA and the non-display area NDA. The display area DA may include a plurality of pixel areas. The non-display area NDA may be disposed to be adjacent to the display area DA. In addition, the first substrate 110 may include the base substrate SUB, and at least one thin film transistor TFT which is disposed in each pixel area on the base substrate SUB.

The protection film PSV may be disposed on the base substrate SUB in which the thin film transistor TFT is disposed.

The plurality of display elements DD may be arranged on the protection film PSV. The plurality of display elements DD may include the first electrode AE which is connected to the thin film transistor TFT, the pixel defining layer PDL which exposes the first electrode AE, the light emitting layer OL which is disposed on the first electrode AE that is exposed by the pixel defining layer PDL, and the second electrode CE which is disposed on the light emitting layer OL.

The plurality of spacers SP may be arranged on the pixel defining layer PDL. The second electrode CE may extend to the pixel defining layer PDL and the plurality of spacers SP. The spacer SP may maintain a constant space between the first substrate 110 and the second substrate 120.

The second substrate 120 may separate the plurality of display elements DD from an external environment. In addition, the second substrate 120 may contain the same material as the base substrate SUB. The second substrate 120 may adhere to the first substrate 110 by a sealant.

The touch sensing electrode TSE may be disposed between the display elements DD and the second substrate 120 in the sensing area SA. For example, the plurality of touch sensing electrodes TSE may be arranged on a surface of the second substrate 120 which faces the first substrate 110. The touch sensing electrode TSE may include at least one first area TSE1 and at least one second area TSE2 which is electrically separated from the first area TSE1. The first area TSE1 may be electrically separated from other areas. In addition, the second area TSE2 may have a shape which surrounds the first area TSE1 in a plan view. That is, the first area TSE1 may have an island shape which is separated within the second area TSE2. The first area TSE1 may overlap the plurality of spacers SP.

The plurality of touch sensing electrodes TSE may include the plurality of conductive fine lines CFL intersecting each other. The plurality of conductive fine lines CFL may include the plurality of first lines CFL1 which extend in one direction, and the plurality of second lines CFL2 which extend in a direction intersecting the plurality of first lines CFL1.

In addition, the conductive fine line CFL may not be provided in the first area TSE1. Hence, the plurality of spacers SP and the plurality of conductive fine lines CFL may not overlap each other in the first area TSE1.

Since the plurality of conductive fine lines CFL and the plurality of spacers SP do not overlap each other in the first area TSE1, it is possible to prevent a parasitic capacitor from being formed between the plurality of conductive fine lines CFL and the second electrode CE on the plurality of spacers SP. Hence, it is possible to prevent touch sensitivity of the display device from decreasing due to parasitic capacitance of the parasitic capacitor.

Figure 21:
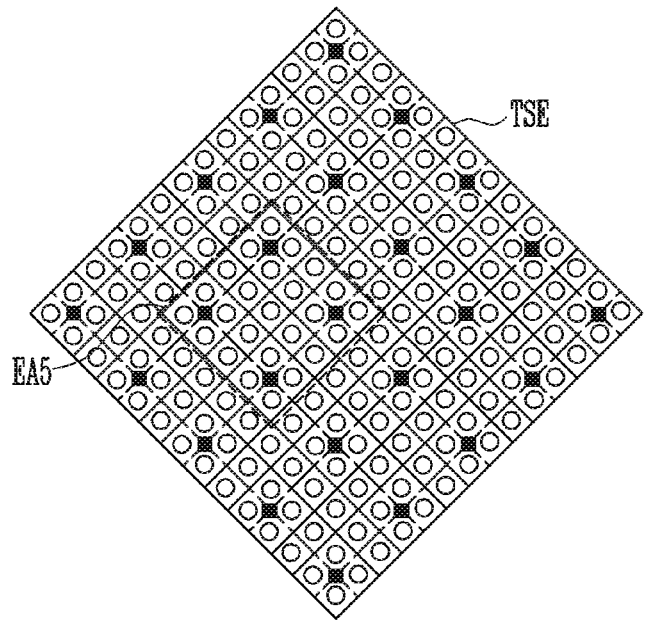
FIG. 21 is a partial plan view illustrating a display device according to still another embodiment of the present disclosure.
Figure 22:
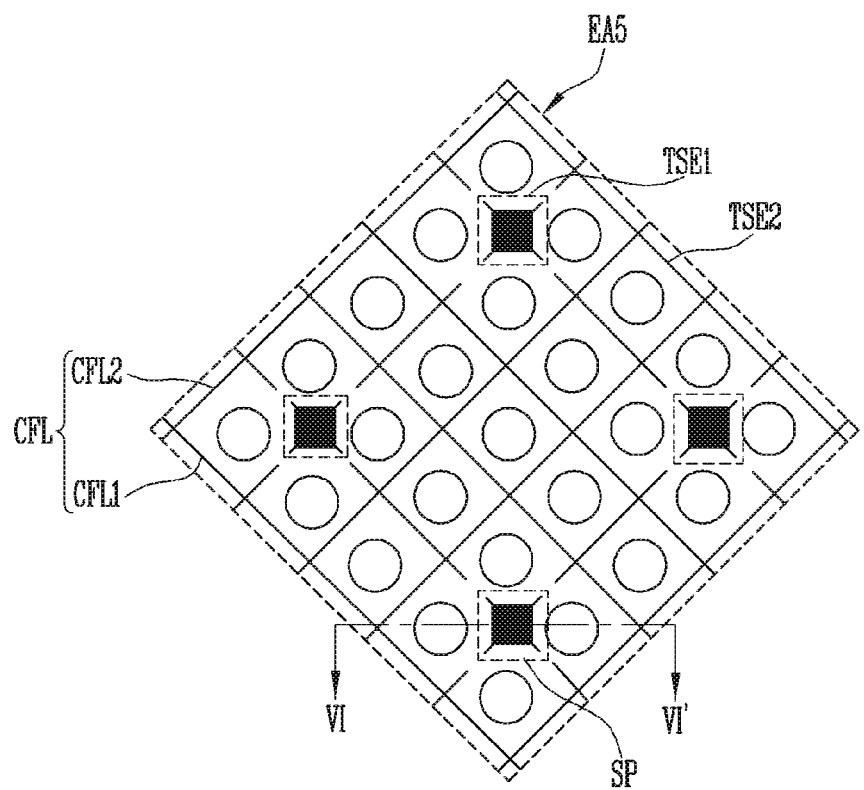
FIG. 22 is an enlarged plan view of an area EA5 of FIG. 21.
Figure 23:
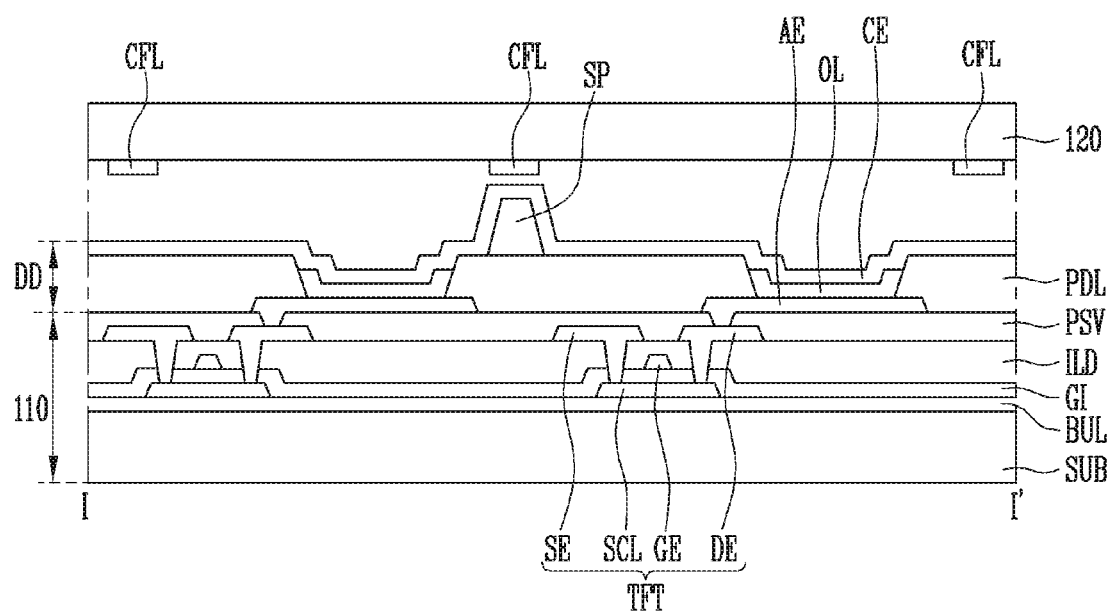
FIG. 23 is a sectional view taken along line VI-VI' of FIG. 22.

FIG. 21 is a partial plan view illustrating a display device according to still another embodiment of the present disclosure, FIG. 22 is an enlarged plan view of an area EA5 of FIG. 21, and FIG. 23 is a sectional view taken along line VI-VI' of FIG. 22.

Referring to FIG. 1 to FIG. 4, and FIG. 21 to FIG. 23, a display device may include the first substrate 110, the plurality of display elements DD which are arranged on the first substrate 110, the plurality of spacers SP which are arranged between the plurality of display elements DD, the second substrate 120 which faces the first substrate 110, and the plurality of touch sensing electrodes TSE that are arranged on a surface of the second substrate 120 which faces the first substrate 110.

The first substrate 110 may include the display area DA and the non-display area NDA. The display area DA may include a plurality of pixel areas. The non-display area NDA may be disposed to be adjacent to the display area DA. In addition, the first substrate 110 may include the base substrate SUB, and at least one thin film transistor TFT which is disposed in each pixel area on the base substrate SUB.

The protection film PSV may be disposed on the base substrate SUB in which the thin film transistor TFT is disposed.

The plurality of display elements DD may be arranged on the protection film PSV. The plurality of display elements DD may include the first electrode AE which is connected to the thin film transistor TFT, the pixel defining layer PDL which exposes the first electrode AE, the light emitting layer OL which is disposed on the first electrode AE that is exposed by the pixel defining layer PDL, and the second electrode CE which is disposed on the light emitting layer OL.

The plurality of spacers SP may be arranged on the pixel defining layer PDL. The second electrode CE may extend to the pixel defining layer PDL and the plurality of spacers SP. The spacer SP may maintain a constant space between the first substrate 110 and the second substrate 120.

The second substrate 120 may separate the plurality of display elements DD from an external environment. In addition, the second substrate 120 may contain the same material as the base substrate SUB. The second substrate 120 may adhere to the first substrate 110 by a sealant.

The touch sensing electrode TSE may be disposed between the display elements DD and the second substrate 120 in the sensing area SA. For example, the plurality of touch sensing electrodes TSE may be arranged on a surface of the second substrate 120 which faces the first substrate 110. The touch sensing electrode TSE may include at least one first area TSE1 and at least one second area TSE2 which is electrically separated from the first area TSE1. The first area TSE1 may be electrically separated from other areas. In addition, the second area TSE2 may have a shape which surrounds the first area TSE1 in a plan view. That is, the first area TSE1 may have an island shape which is separated within the second area TSE2. The first area TSE1 may overlap the plurality of spacers SP.

The plurality of touch sensing electrodes TSE may include the plurality of conductive fine lines CFL intersecting each other. The plurality of conductive fine lines CFL may include the plurality of first lines CFL1 which extend in one direction, and the plurality of second lines CFL2 which extend in a direction intersecting the plurality of first lines CFL1.

The plurality of conductive fine lines CFL which are arranged in the first area TSE1 may be electrically separated from the plurality of conductive fine lines CFL which are arranged on the second area TSE2. That is, the plurality of conductive fine lines CFL which overlap the plurality of spacers SP may be electrically separated from other areas in the first area TSE1. Hence, even if the conductive fine line CFL may overlap the plurality of spacers SP in the first area TSE1, it is possible to prevent a parasitic capacitor from being formed between the conductive fine line CFL and the second electrode CE on the plurality of spacers SP. Hence, it is possible to prevent touch sensitivity of the display device from decreasing due to parasitic capacitance of the parasitic capacitor.

The detailed description above exemplifies and explains the present disclosure. In addition, the aforementioned description just expresses and explains embodiments of the present disclosure. As described above, the present disclosure may be used in various combinations, modifications, and environment, and may be changed or modified within a range of concept of the disclosure described in the present specification, an equivalent range to the described content, and/or technology of the art or a range of knowledge. Therefore, the aforementioned description of the disclosure above is not intended to limit the present disclosure by the described embodiments. In addition, the accompanying scope may be interpreted to include other embodiments.

What is claimed is:

1. A display device comprising:
a first substrate including a plurality of pixel areas;
a plurality of display elements disposed on the first substrate;
a plurality of spacers disposed between the plurality of pixel areas;
a second substrate facing the first substrate;
touch sensing electrodes disposed on a surface of the second substrate which faces the first substrate;
a filling material disposed between the first substrate and the second substrate; and
an encapsulating layer disposed between the filling material and the plurality of display elements,
wherein each of the touch sensing electrodes includes at least one first area and at least one second area that is electrically separated from the first area.

2. The display device of claim 1, wherein the filling material covers the plurality of display elements and the encapsulating layer.

3. The display device of claim 2, wherein the filling material includes polymer.

4. The display device of claim 1, further comprising:
a pixel defining layer disposed between the plurality of pixel areas,
wherein each of the plurality of spacers overlaps with the pixel defining layer when viewed perpendicularly to a major surface of the substrate.

5. The display device of claim 4, wherein:
the each of the touch sensing electrodes includes a plurality of metal mesh lines and an opening part located between the plurality of metal mesh lines, and
the second area is an area excluding the opening part.

6. The display device of claim 5, wherein the plurality of metal mesh lines include:
a first conductive layer directly disposed on the surface of the second substrate; and
a second conductive layer disposed on the first conductive layer and electrically connected to the first conductive layer through a contact hole in a first cover film,
wherein the first cover film is disposed between the first conductive layer and the second conductive layer.

7. The display device of claim 6, further comprising:
a second cover film covering the second conductive layer.

8. The display device of claim 5, wherein each of the plurality of display elements includes:
a first electrode disposed in each of the plurality of pixel areas;
the pixel defining layer including an opening exposing a portion of the first electrode;
a light emitting layer disposed on the exposed portion of the first electrode; and
a second electrode disposed on the light emitting layer, and
wherein the plurality of spacers are disposed on the pixel defining layer, and the second electrode is disposed on the pixel defining layer and the plurality of spacers.

9. The display device of claim 8, wherein the encapsulating layer is disposed between the second electrode and the filling material.

10. The display device of claim 5, wherein the plurality of metal mesh lines include:
a plurality of first metal mesh lines extending in a first direction; and
a plurality of second metal mesh lines extending in a second direction intersecting the first direction.

11. The display device of claim 10, wherein:
at least parts of the plurality of display elements are disposed in the opening part of the first area of the each of the touch sensing electrodes;
other parts of the plurality of display elements are disposed between the first area and the second area; and
remaining parts of the plurality of display elements are disposed in the second area of the each of the touch sensing electrodes.

12. The display device of claim 10, wherein the first and second metal mesh lines are disposed to correspond to the second area.

13. The display device of claim 1, wherein the first substrate is adhered to the second substrate by the filling material.

14. The display device of claim 13, wherein each of the first substrate and the second substrate includes a flexible substrate.

15. A display device comprising:
- a substrate including a plurality of pixel areas;
- a plurality of display elements disposed on the substrate;
- a pixel defining layer disposed between the plurality of pixel areas;
- a plurality of spacers disposed between the plurality of pixel areas;
- an encapsulating layer disposed on the plurality of display elements; and
- touch sensing electrodes disposed on the encapsulating layer, each of the touch sensing electrodes including a plurality of metal mesh lines and an opening part located between the plurality of metal mesh lines,
- wherein each of the plurality of spacers overlaps with the pixel defining layer when viewed perpendicularly to a major surface of the substrate,
- wherein the each of the touch sensing electrodes includes a first area having the opening part and a second area electrically insulated from the first area,
- wherein the second area is an area excluding the opening part, and
- wherein at least parts of the plurality of display elements are disposed in the opening part of the first area of the each of the touch sensing electrodes.

16. The display device of claim 15, wherein:
- other parts of the plurality of display elements are disposed between the first area and the second area; and
- remaining parts of the plurality of display elements are disposed in the second region of the each of the touch sensing electrodes.

17. The display device of claim 15, wherein the opening part is formed by cutting a portion of at least two metal mesh lines extending in one direction among the plurality of metal mesh lines.

18. The display device of claim 17, wherein the second area has a shape which surrounds the opening part in a plan view.

19. The display device of claim 18, wherein the plurality of metal mesh lines include first metal mesh lines extending in a first direction and second metal mesh lines extending in a second direction crossing the first direction.

20. The display device of claim 19, wherein the first and second metal mesh lines are disposed to correspond to the second area.

* * * * *